United States Patent [19]
Inoue

[11] Patent Number: 5,482,870
[45] Date of Patent: Jan. 9, 1996

[54] METHODS FOR MANUFACTURING LOW LEAKAGE CURRENT OFFSET-GATE THIN FILM TRANSISTOR

[75] Inventor: Satoshi Inoue, Suwa, Japan

[73] Assignee: Seiko Epson Corporation, Tokyo, Japan

[21] Appl. No.: 184,619

[22] Filed: Jan. 18, 1994

Related U.S. Application Data

[62] Division of Ser. No. 984,825, Dec. 3, 1992, which is a division of Ser. No. 708,154, May 31, 1991, Pat. No. 5,208,476.

[30] Foreign Application Priority Data

Jun. 8, 1990 [JP] Japan .................................. 2-150151

[51] Int. Cl.$^6$ ....................... H01L 21/266; H01L 21/84
[52] U.S. Cl. ................. 437/21; 437/909; 437/41
[58] Field of Search ............................. 437/21, 41, 909, 437/101

[56] References Cited

U.S. PATENT DOCUMENTS

| | | | |
|---|---|---|---|
| 4,751,196 | 6/1988 | Pennell et al. | 437/84 |
| 4,965,213 | 10/1990 | Blake | 437/21 |

FOREIGN PATENT DOCUMENTS

| | | |
|---|---|---|
| 159617 | 10/1985 | European Pat. Off. . |
| 190928 | 8/1986 | European Pat. Off. . |
| 195607 | 9/1986 | European Pat. Off. . |
| 399737 | 11/1990 | European Pat. Off. . |
| 58-115864 | 7/1983 | Japan . |
| 60-224275A | 11/1985 | Japan .................. 437/21 |
| 63-86573 | 4/1988 | Japan . |
| 0189464 | 4/1989 | Japan . |
| 2-5572 | 1/1990 | Japan . |
| 3109739A | 5/1991 | Japan .................. 437/21 |

OTHER PUBLICATIONS

Electron Device Letters, "Laser-Recrystallized Polycrystalline-Silicon Thin-Film Transistors with Low Leakage Current and High Switching Ratio", Shunji Seki, Osamu Kogure, and Bunjiro Tsujiyama, vol. EDL-8 No. 9, Sep. 1987, pp. 425–427.

Primary Examiner—Olik Chaudhuri
Assistant Examiner—Richard A. Booth
Attorney, Agent, or Firm—Harold T. Tsiang

[57] ABSTRACT

A thin film transistor structure and methods of manufacture provide high ON/OFF current ratio and significantly reduce OFF state leakage currents. A doped thin film disposed on an insulating substrate is etched to form opposing source and drain regions. An undoped thin film is disposed between the opposing source and drain regions so that there is some overlap of the undoped thin film onto the top sides of the source and drain regions. Conventional photomasking, etching and ion implantation steps are then used to form a gate electrode offset from at least the drain region, and preferably offset from both source and drain regions, as well as conventional insulation and interconnect layers. The reduction in electric field intensity in the drain region, and the reduction in trap state density result from, performing heavy junction doping prior to deposition of the undoped thin film, and offsetting the gate electrode from the drain region. This structure provides very low OFF state leakage current while not seriously affecting the ON current. Several alternative fabrication processes are disclosed.

12 Claims, 13 Drawing Sheets

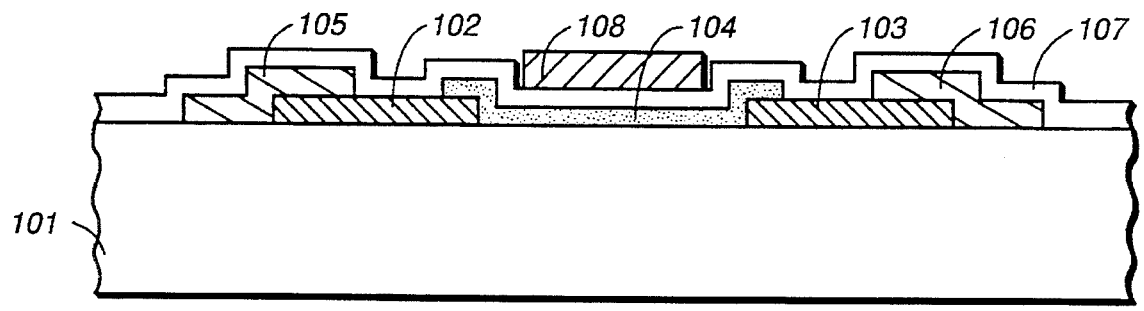
FIG._1
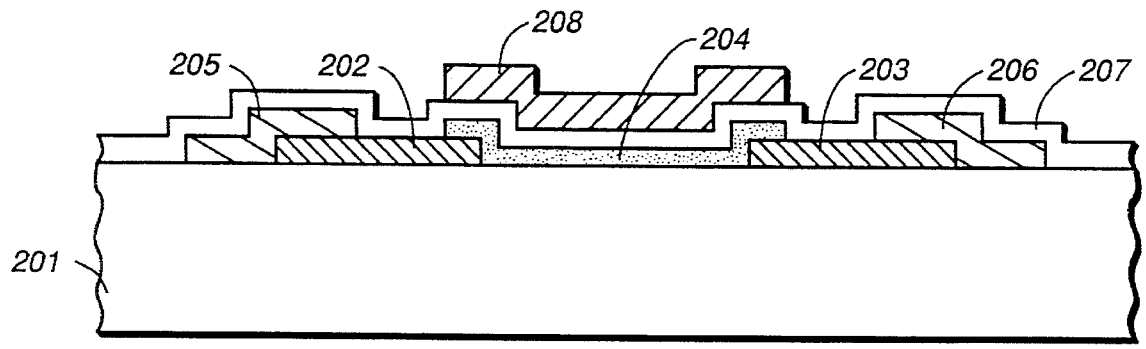
FIG._2
(PRIOR ART)
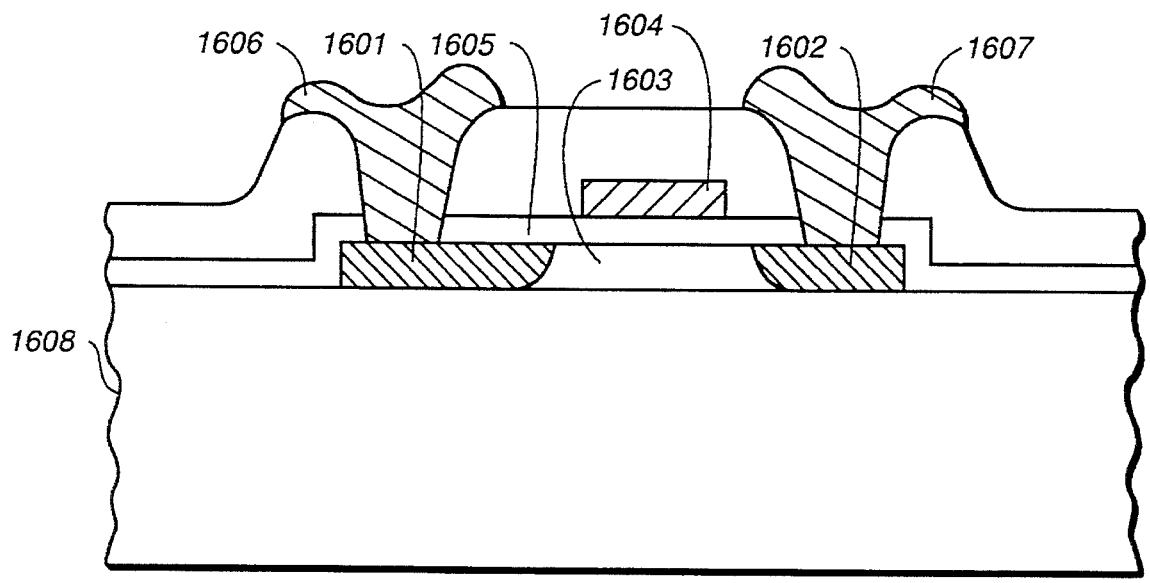
FIG._16

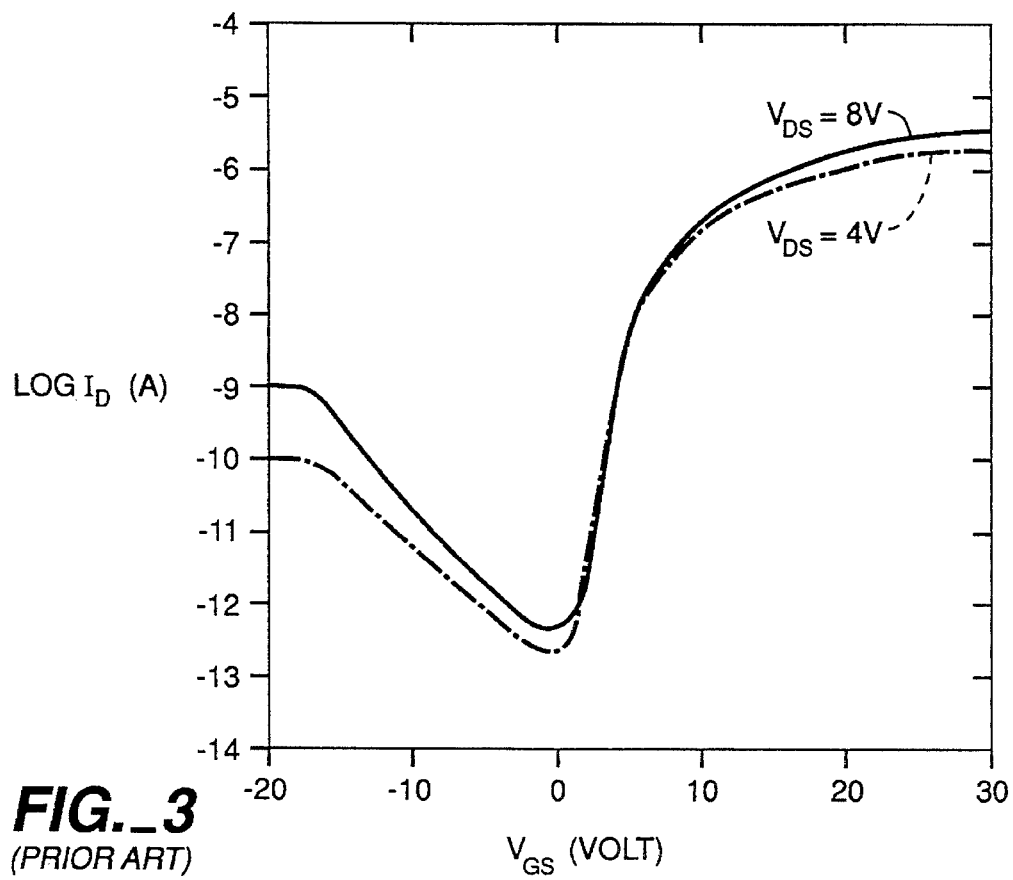
FIG._3
*(PRIOR ART)*
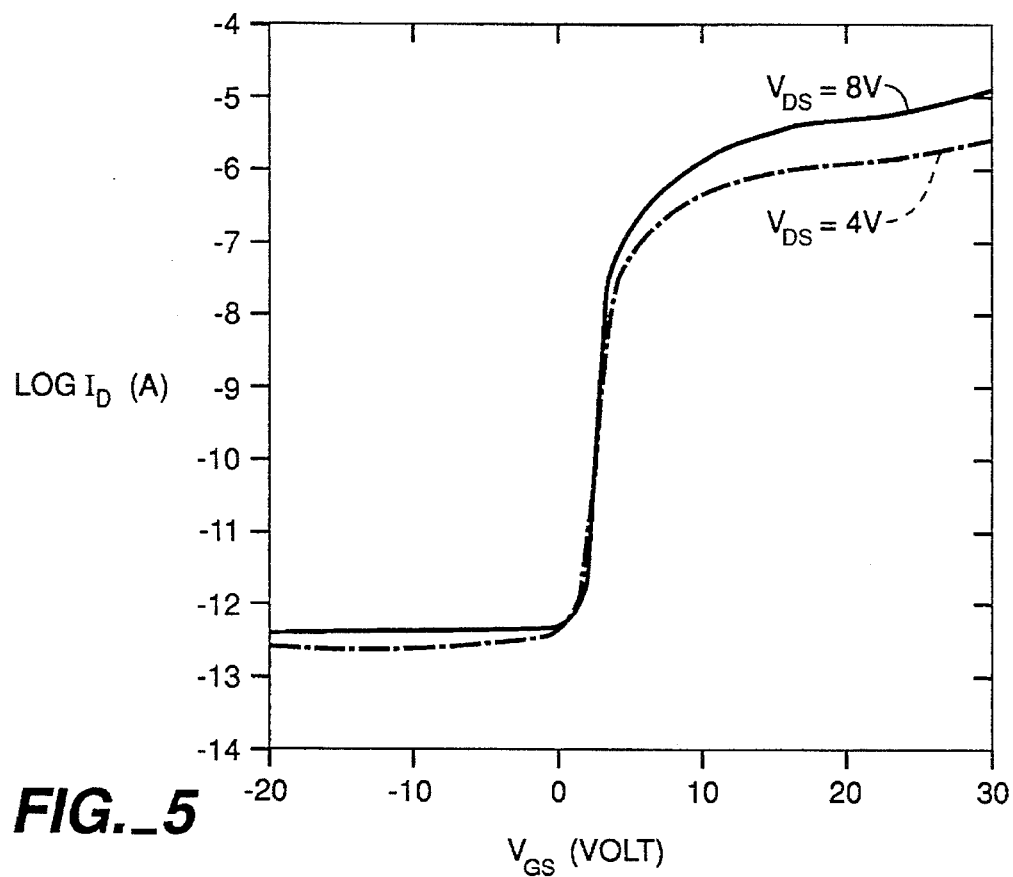
FIG._5

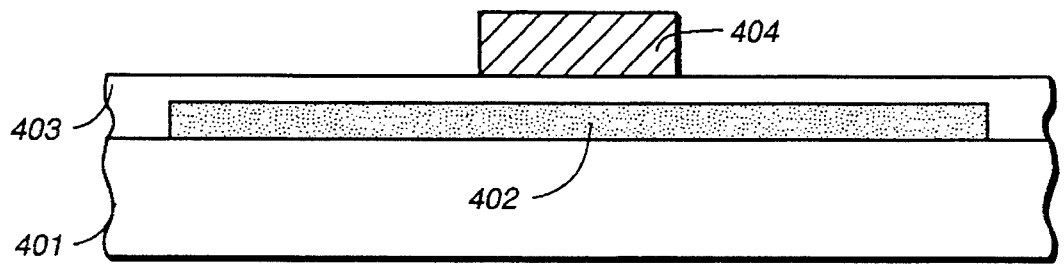
FIG._4A
(PRIOR ART)
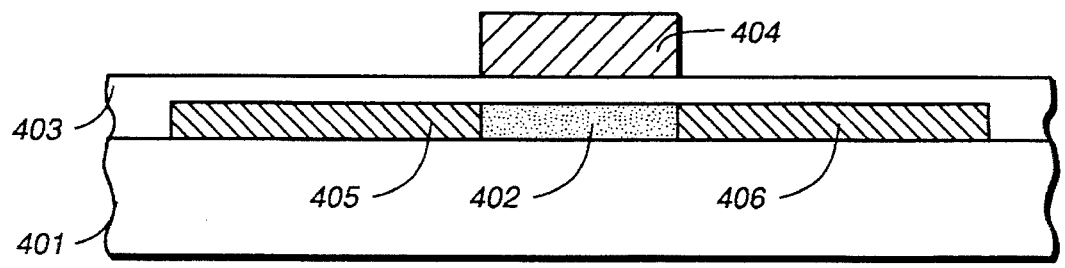
FIG._4B
(PRIOR ART)
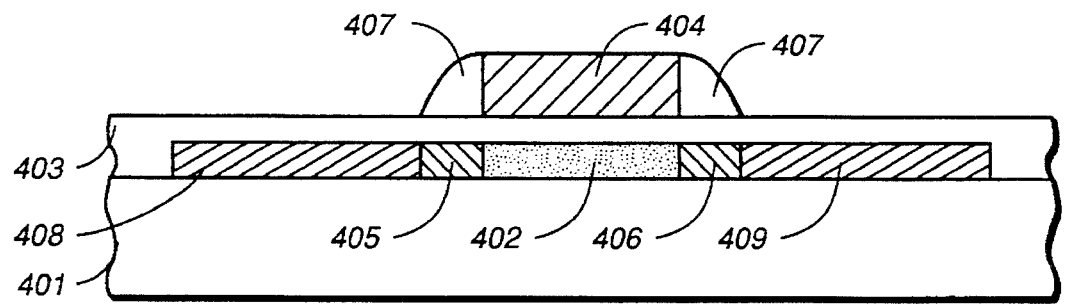
FIG._4C
(PRIOR ART)
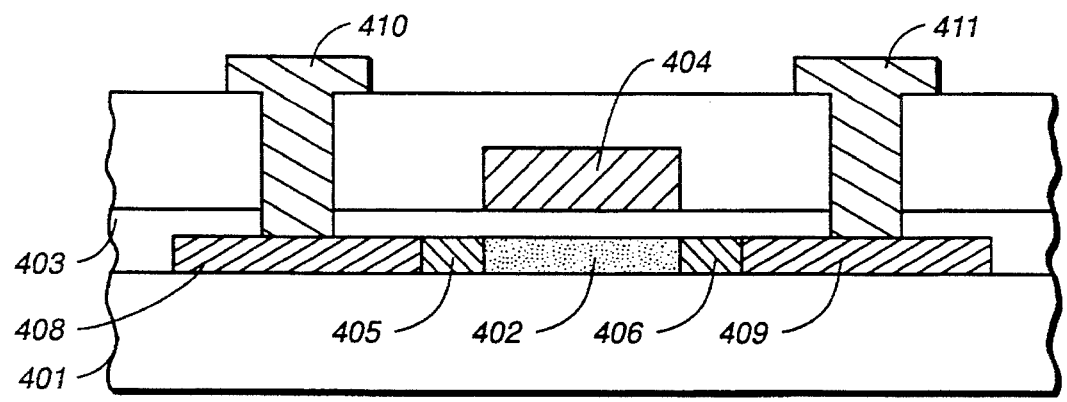
FIG._4D
(PRIOR ART)

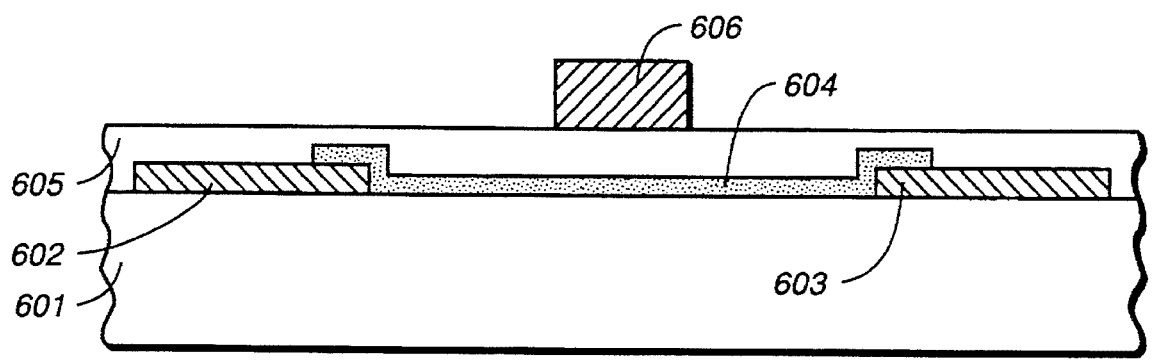
FIG._6A
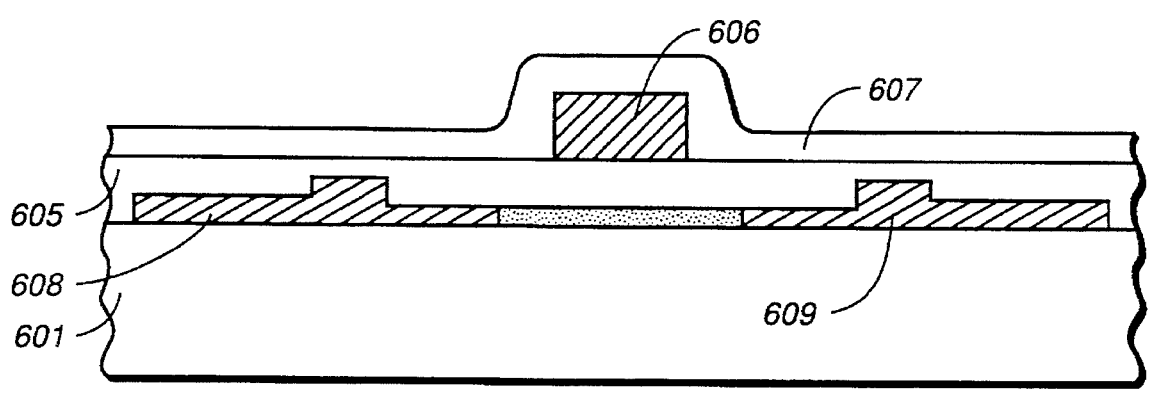
FIG._6B
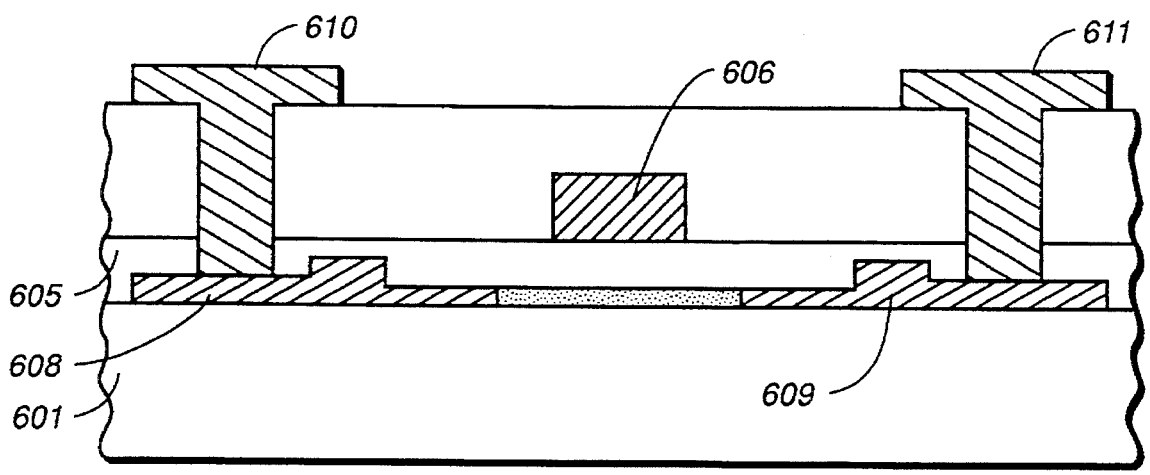
FIG._6C

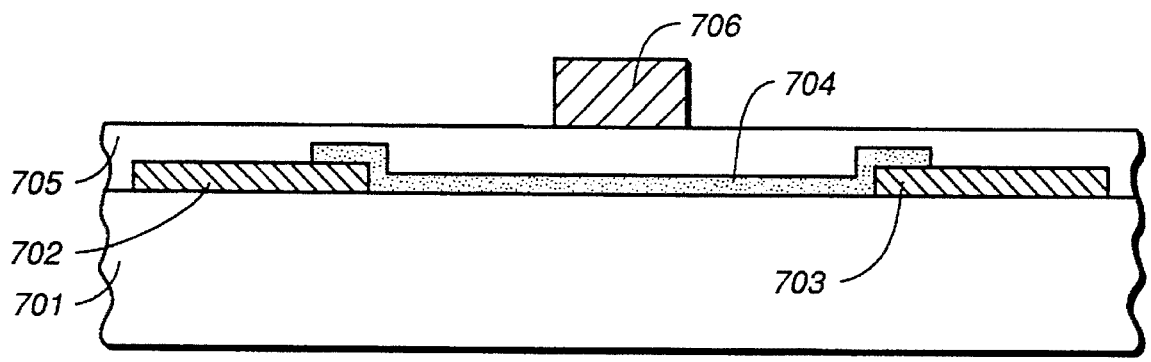
FIG._7A
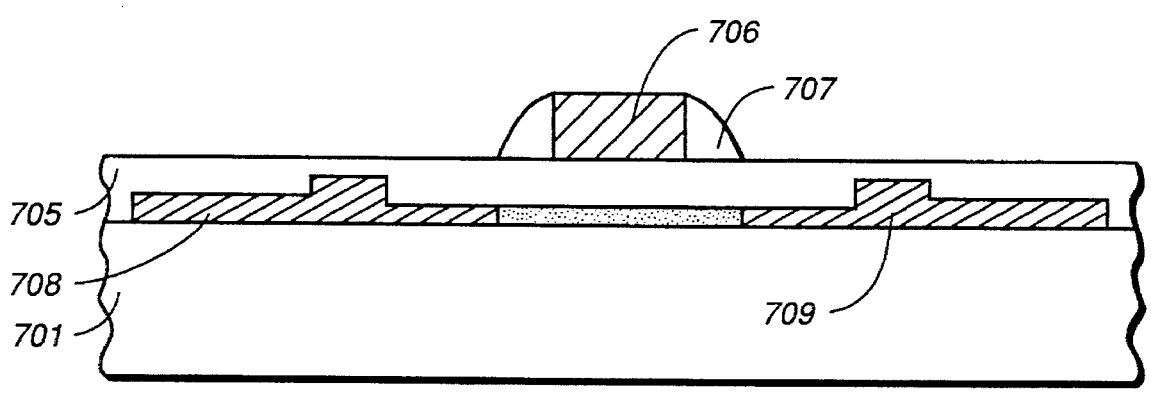
FIG._7B
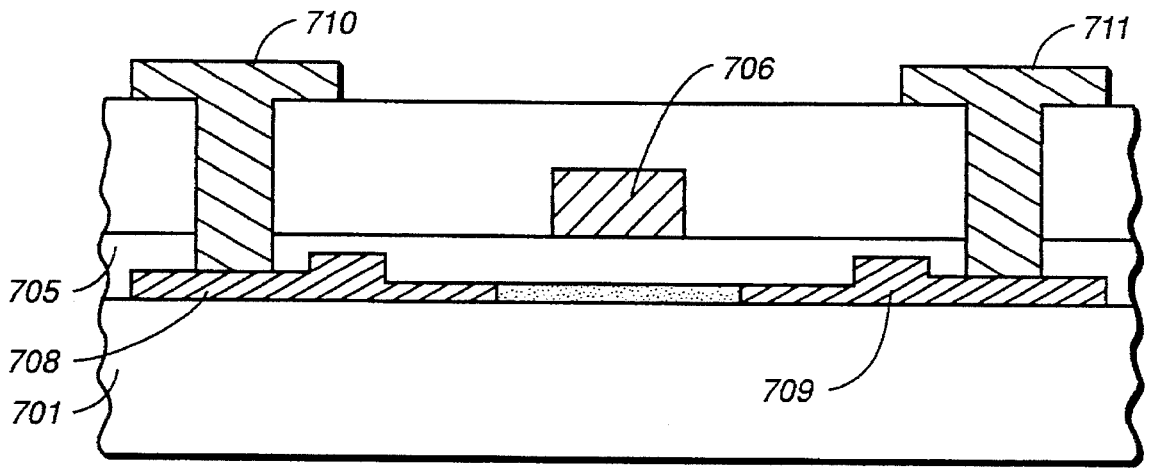
FIG._7C

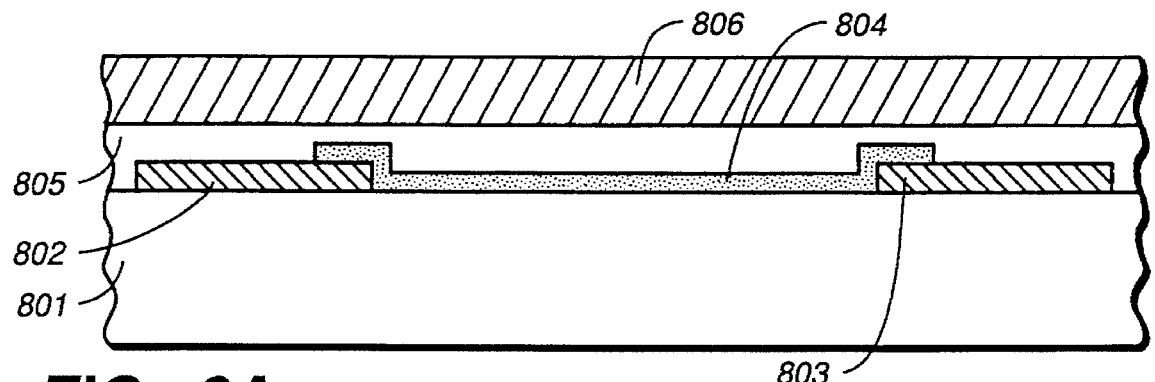
FIG._8A
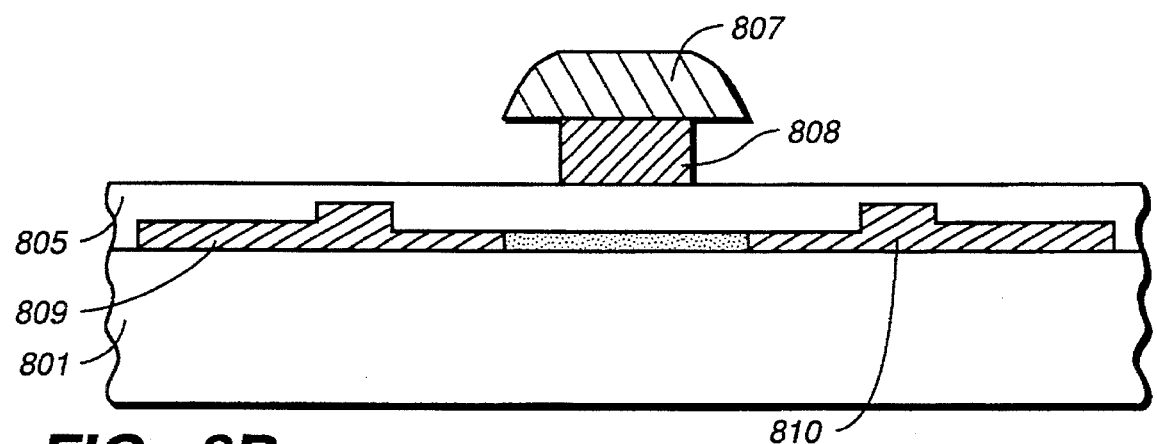
FIG._8B
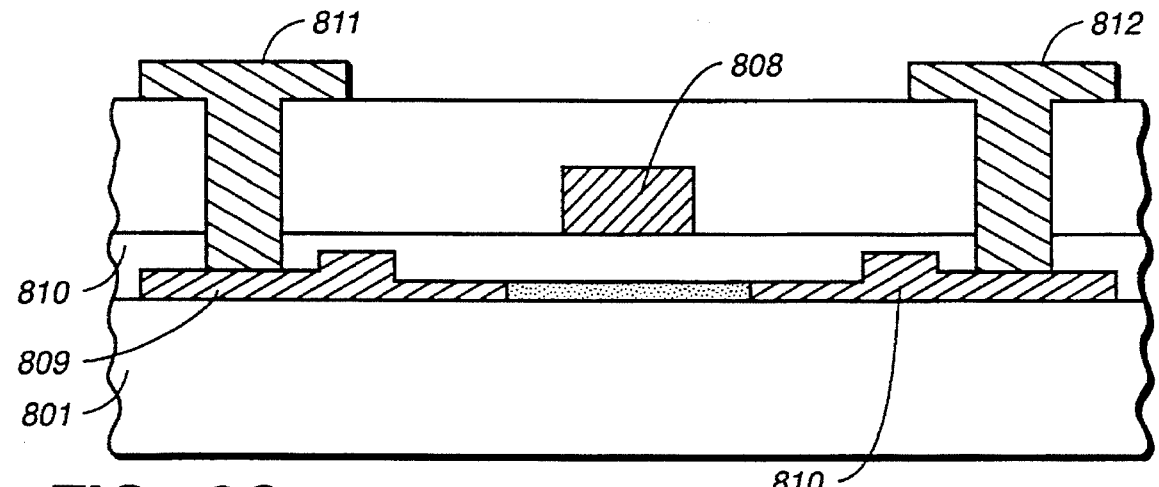
FIG._8C

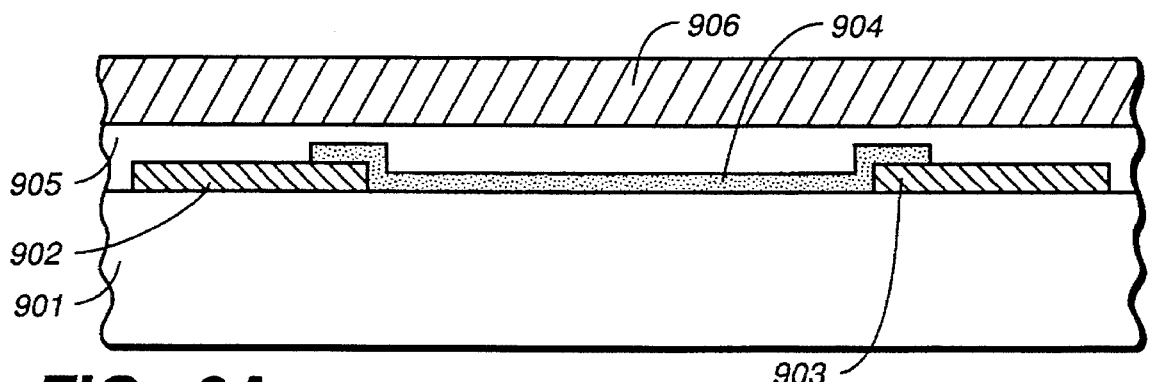
FIG._9A
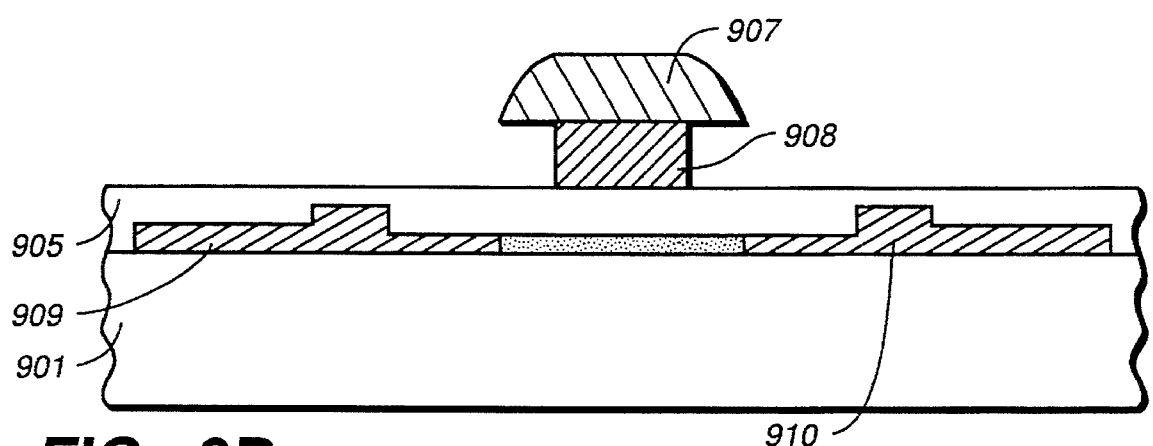
FIG._9B
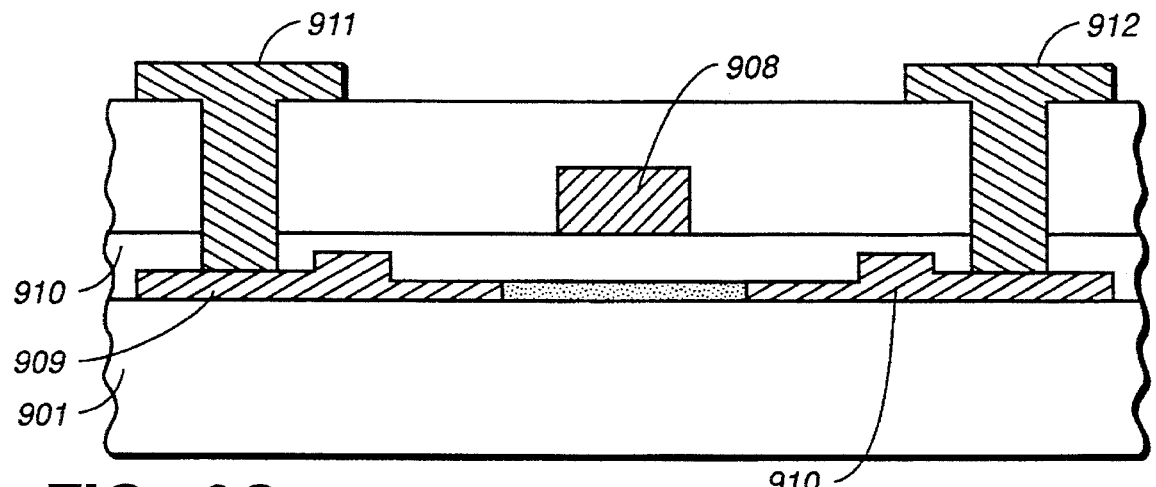
FIG._9C

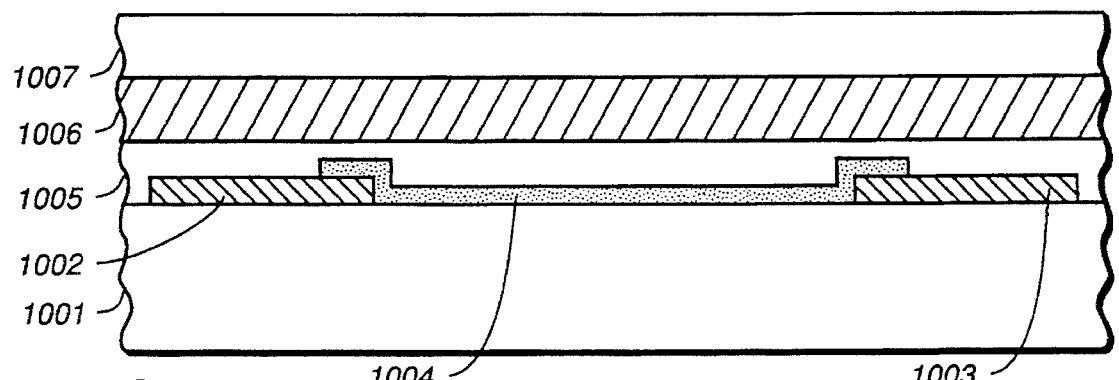
FIG._10A
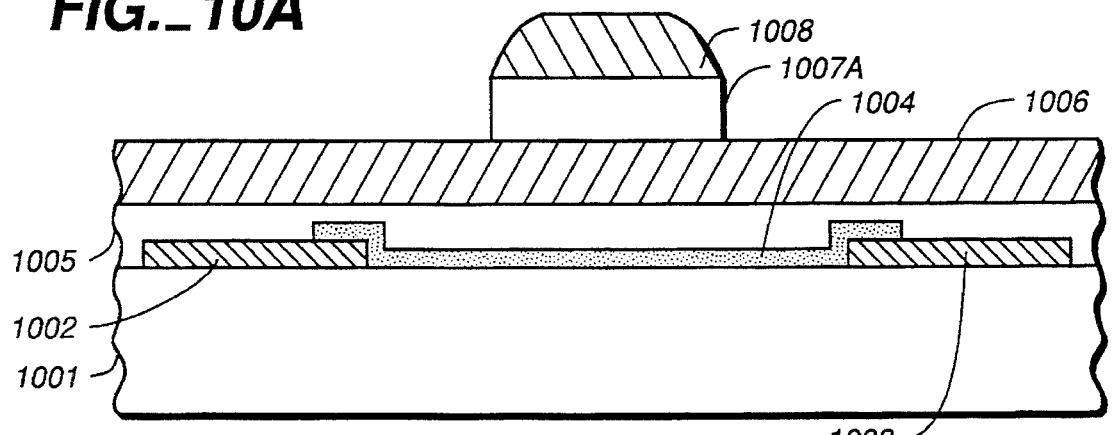
FIG._10B
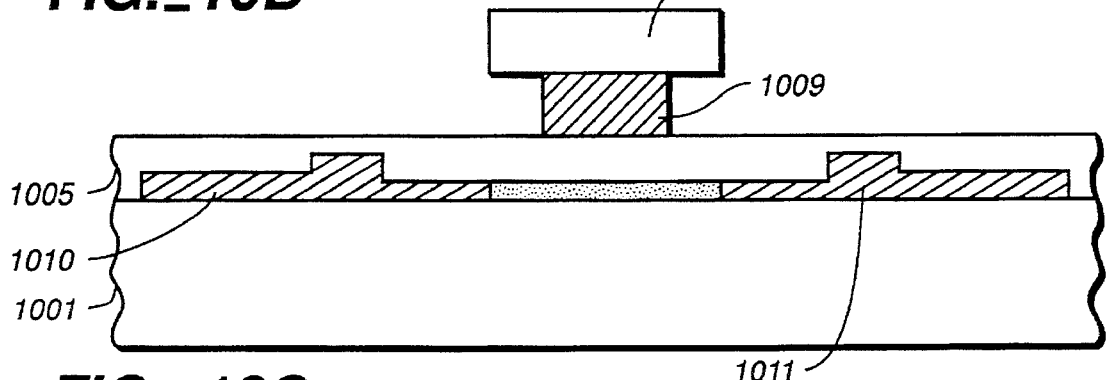
FIG._10C
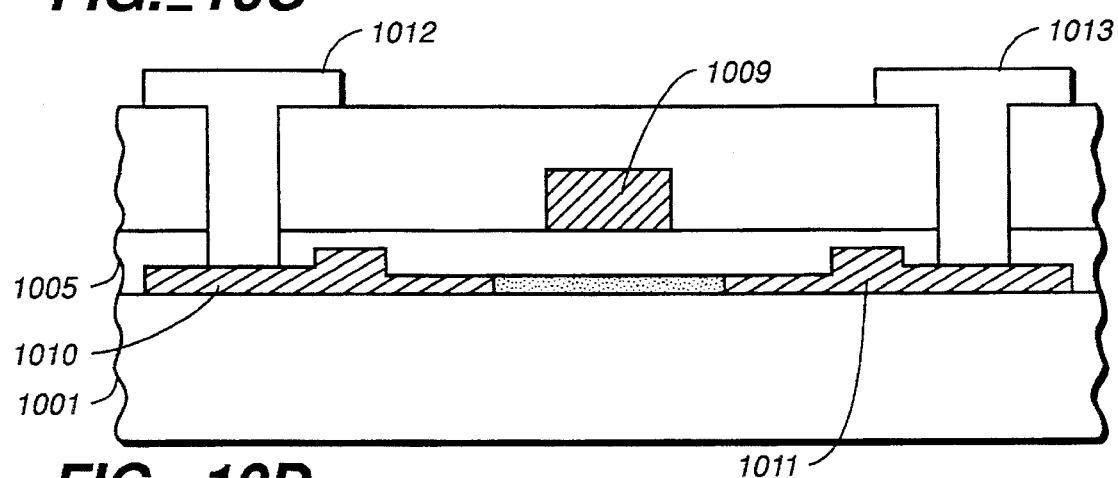
FIG._10D

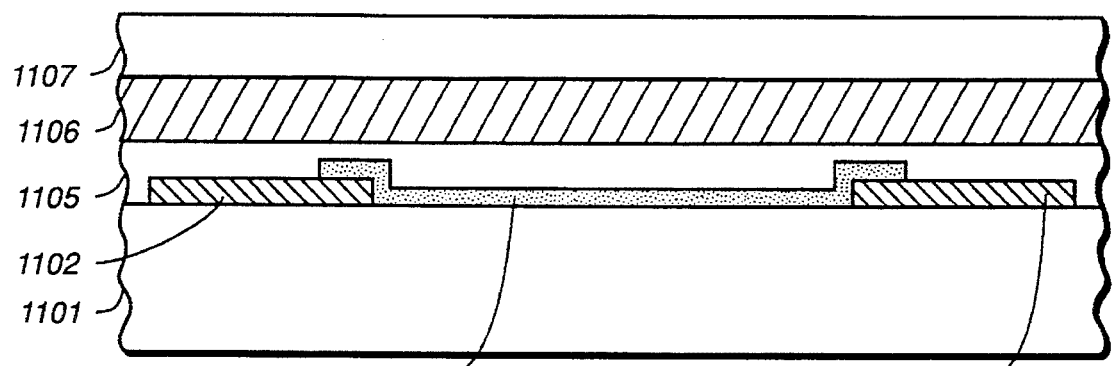
FIG._11A
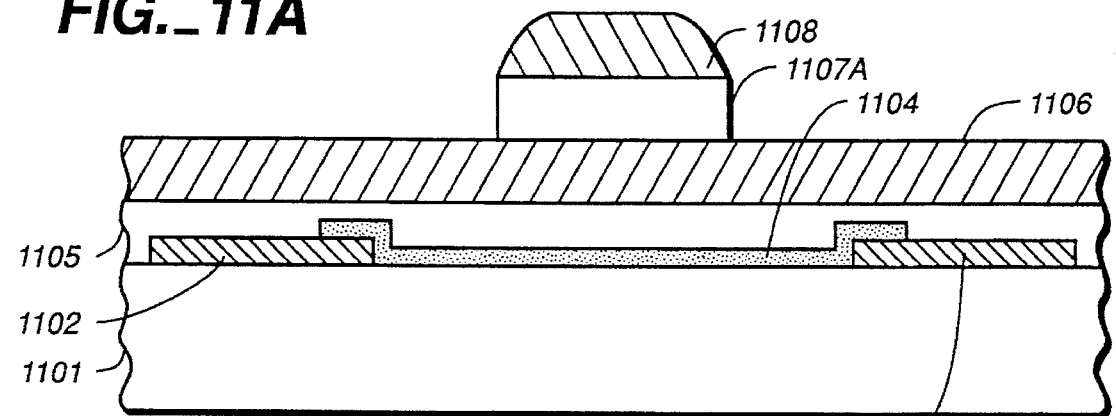
FIG._11B
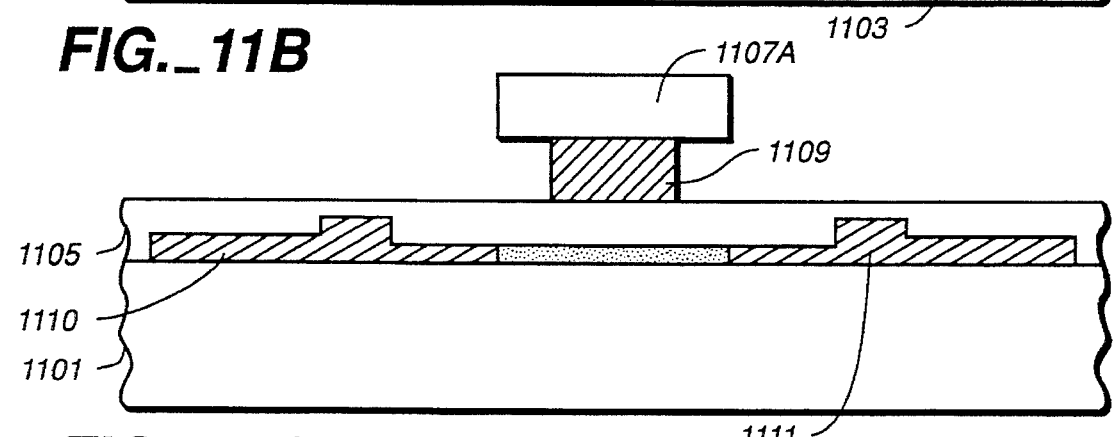
FIG._11C
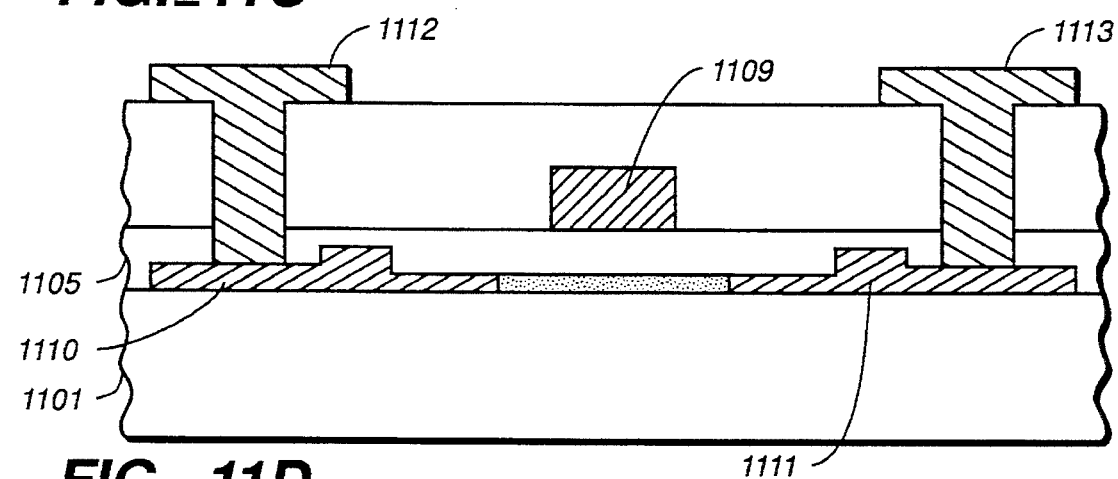
FIG._11D

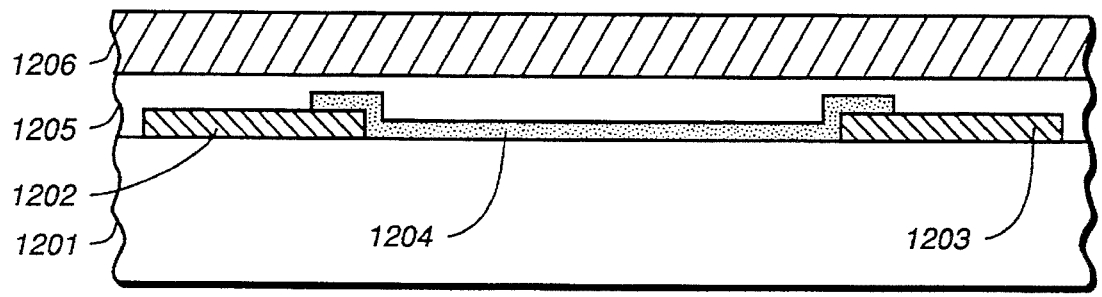
FIG._12A
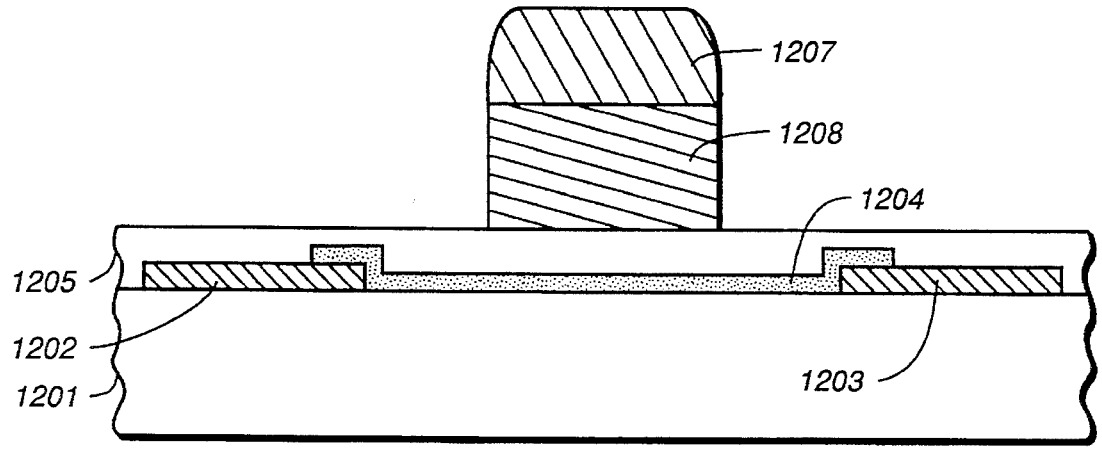
FIG._12B
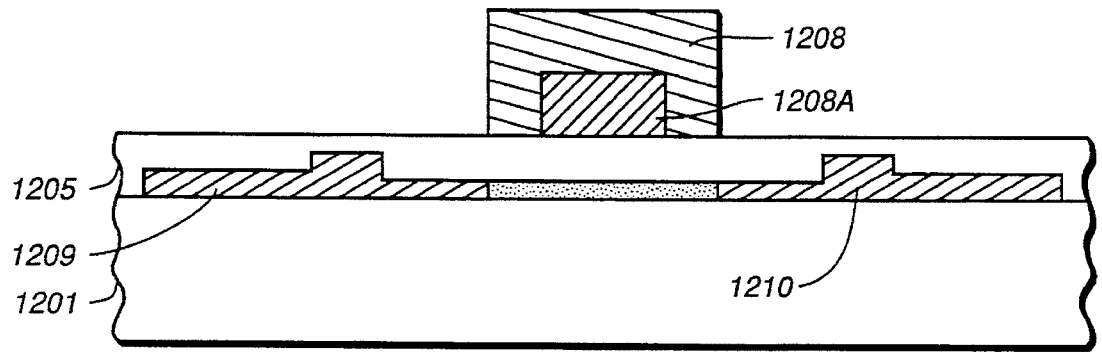
FIG._12C
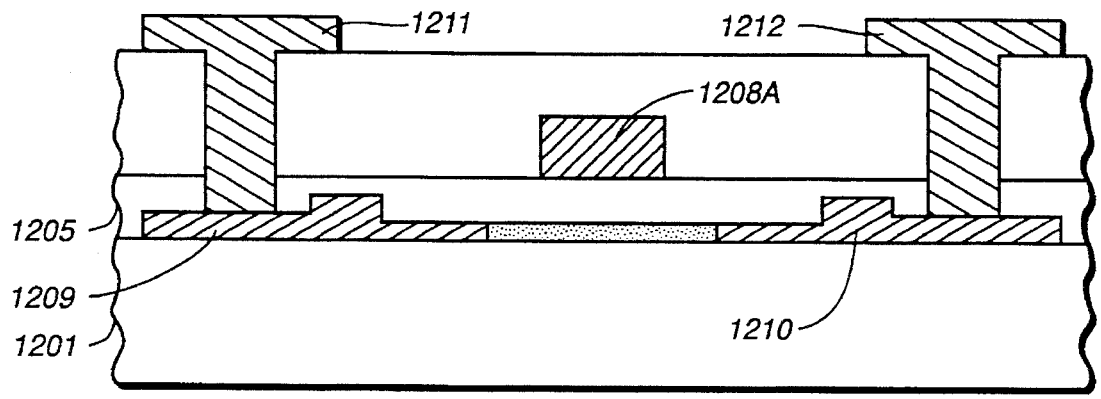
FIG._12D

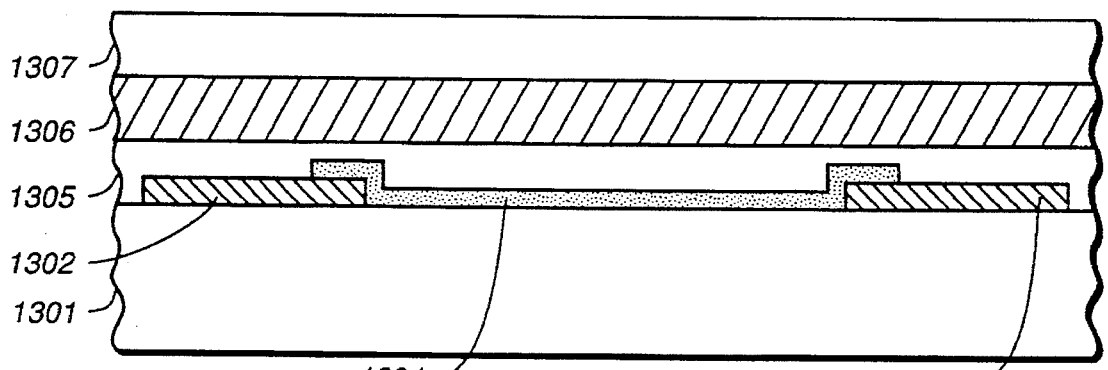
FIG._13A
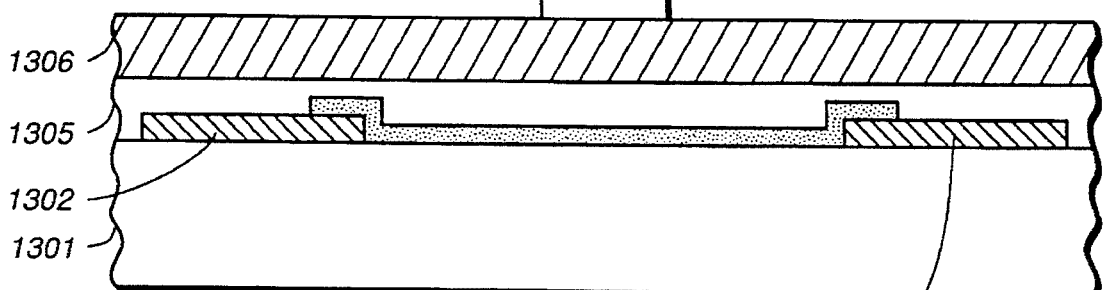
FIG._13B
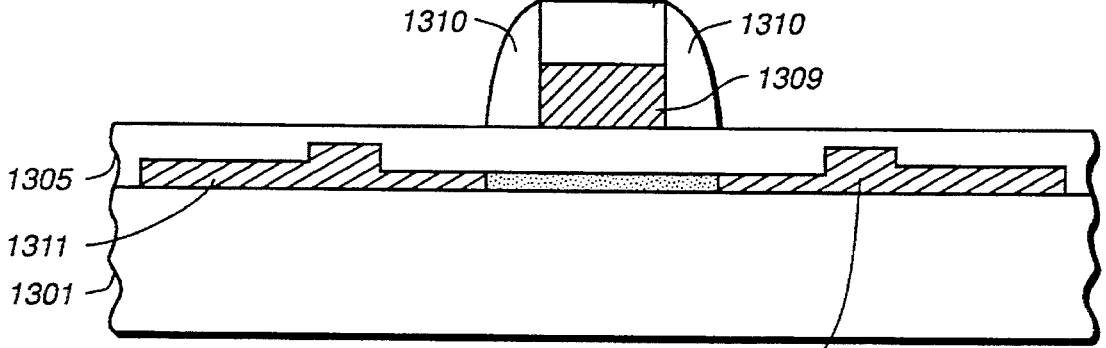
FIG._13C
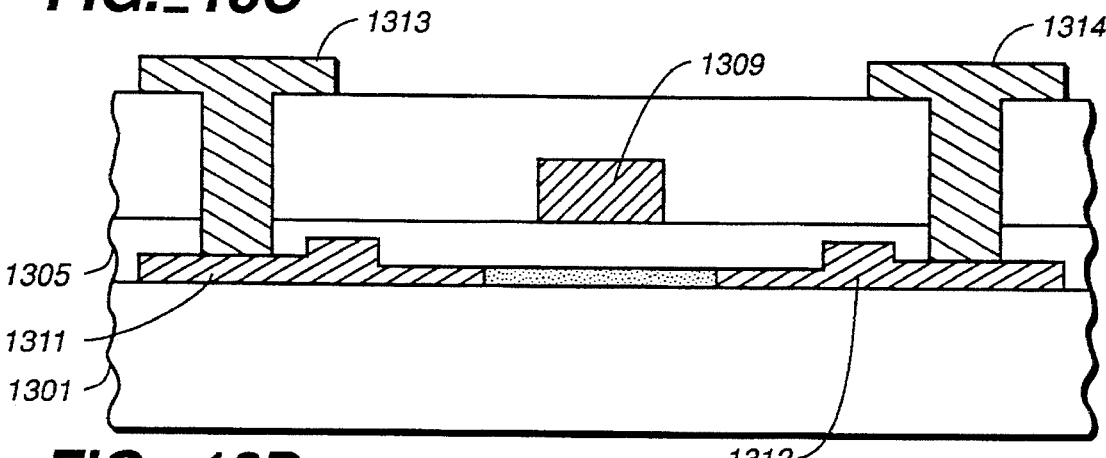
FIG._13D

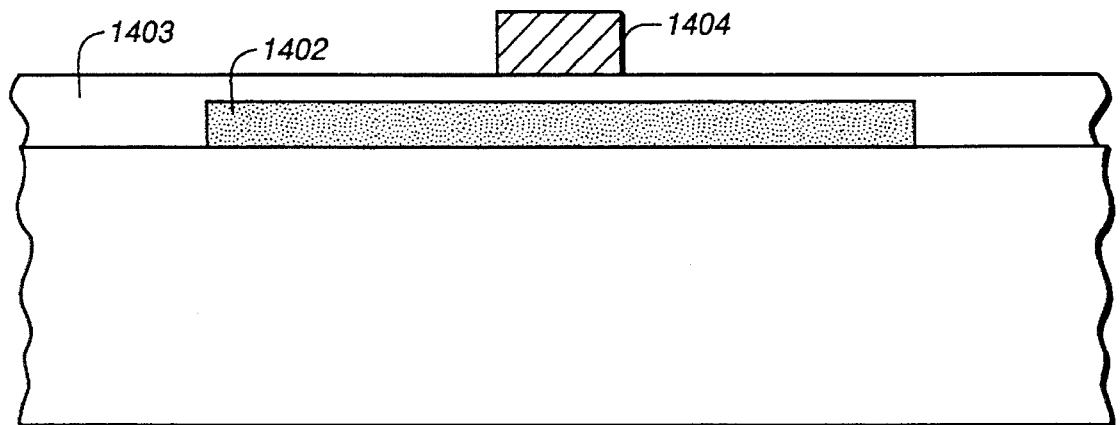
FIG._14A
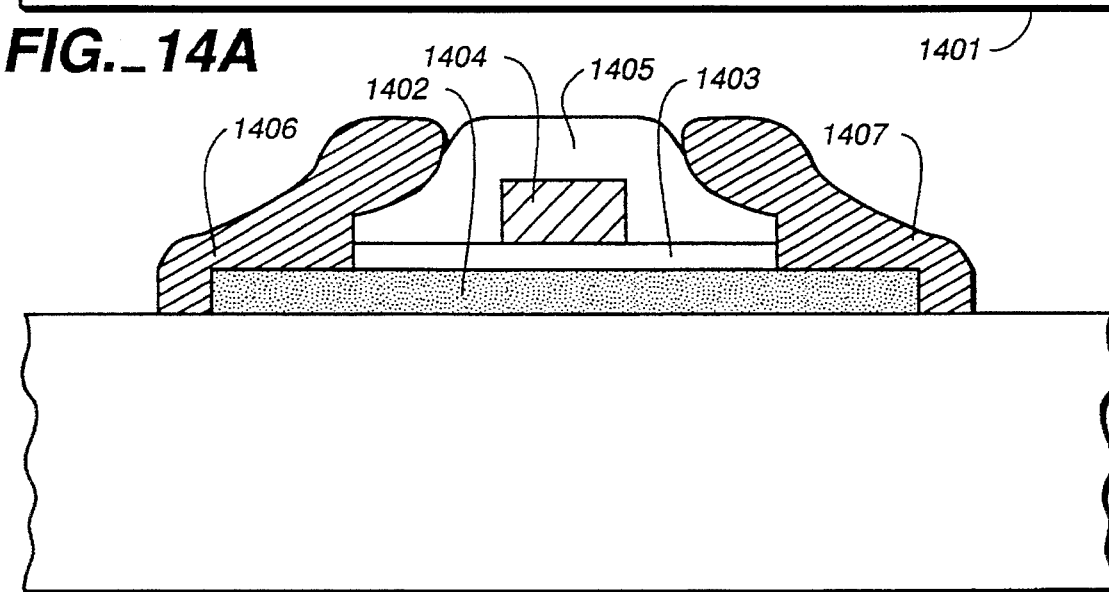
FIG._14B
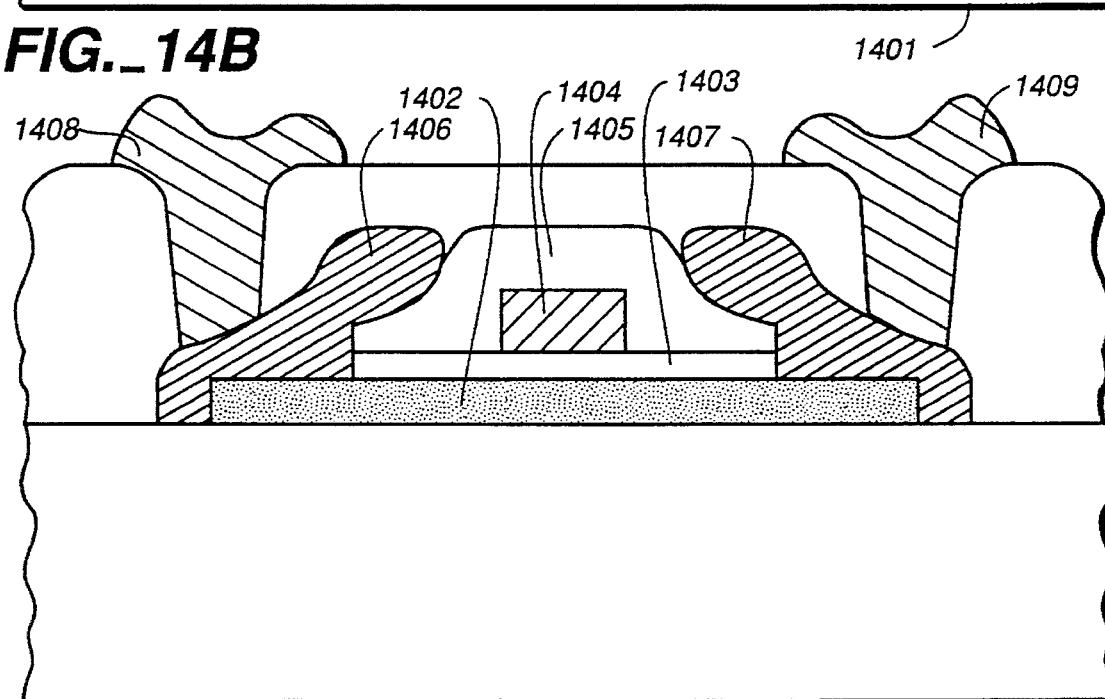
FIG._14C

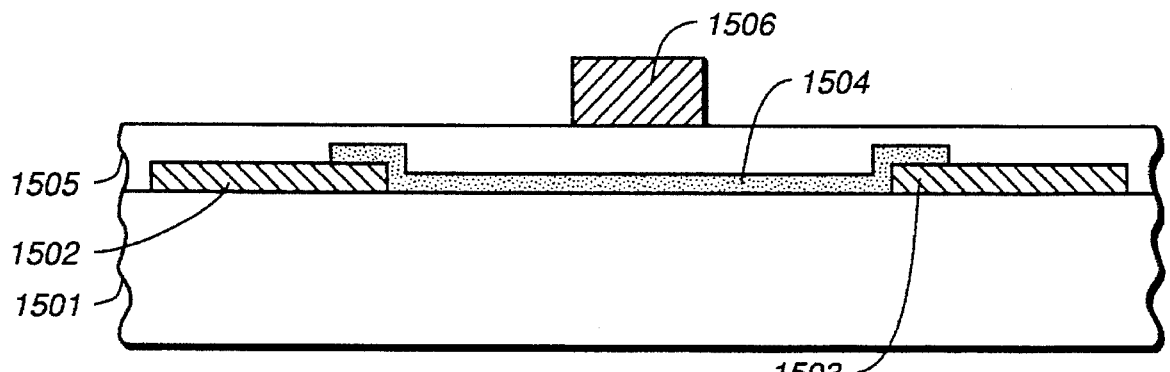
FIG._15A
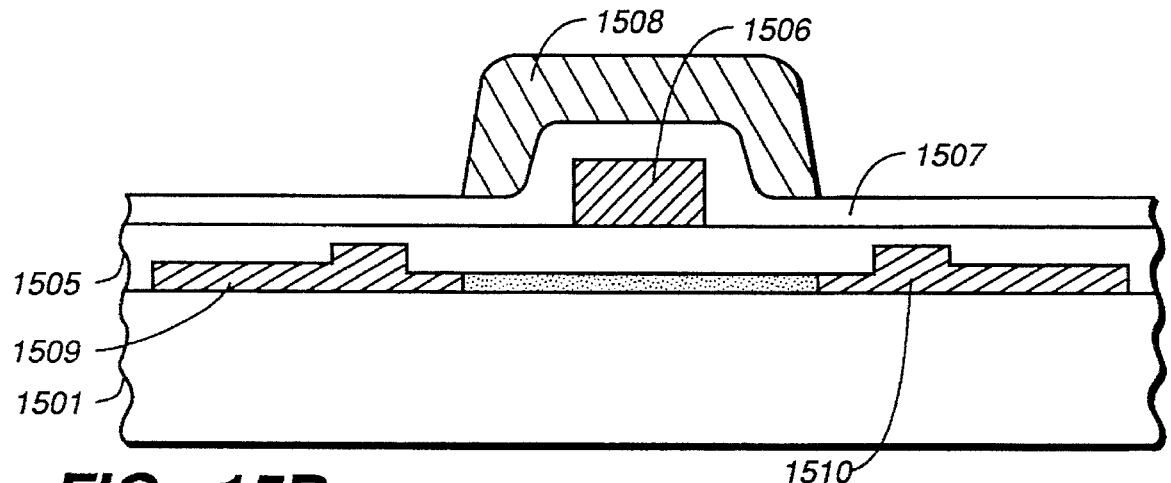
FIG._15B
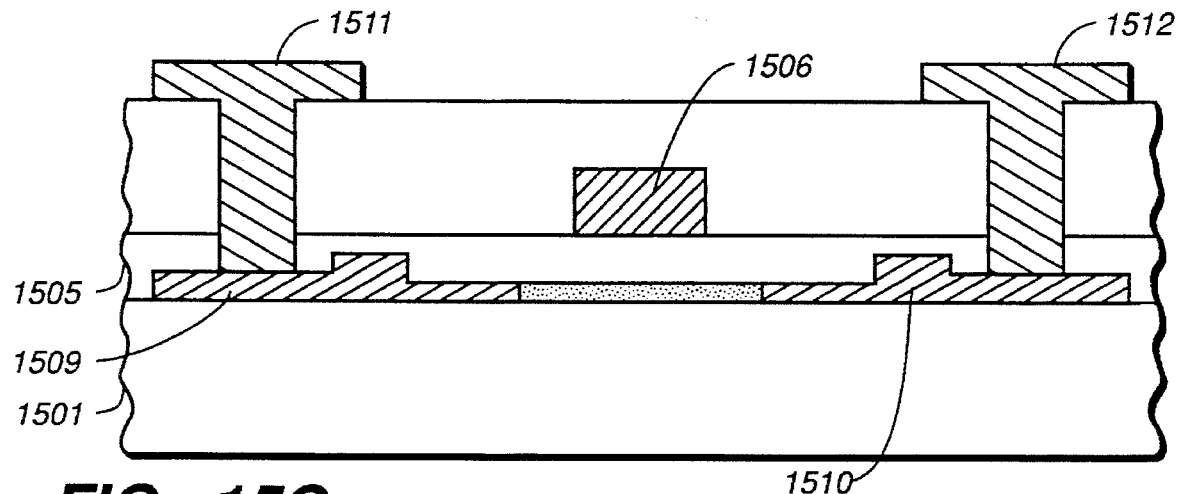
FIG._15C

METHODS FOR MANUFACTURING LOW LEAKAGE CURRENT OFFSET-GATE THIN FILM TRANSISTOR

This is a division, of application Ser. No. 07/984,825 filed on Dec. 3, 1992, which is a division of application Ser. No. 07/708,154, filed May 31, 1991, now U.S. Pat. No. 5,208,476.

BACKGROUND OF THE INVENTION

The present invention relates to a thin film transistor which is particularly suitable for use in applications such as active matrix liquid crystal devices, image sensors, or three-dimensional integrated circuits.

Early thin film transistors had undesirably high OFF state leakage currents. One approach to overcoming this problem involved lightly doped drain structures, while another approach involved offset-gate structures. The following section details the structure and manufacture of previous thin film transistors and highlights the inherent problems which are overcome by the present invention.

DESCRIPTION OF RELATED ART

An example of the production and structure of a conventional thin film transistor (TFT) is explained with reference to FIG. 2, which shows a cross-sectional view of a conventional TFT structure.

Source and drain areas, or regions, 202, 203, comprised of a silicon thin film, such as polycrystalline silicon (poly-Si) or amorphous silicon (a-Si), into which a donor or acceptor impurity is added, are formed on an insulating substrate 201 such as glass, quartz, or sapphire. Donor type impurity atoms, such as arsenic and phosphorous, form N-type regions. Acceptor type impurity atoms such as boron form P-type regions. The selection of N-type or P-type dopants is a matter of design choice well understood by those skilled in the art.

Channel area 204, comprised of a silicon thin film, such as poly-Si or a-Si, is disposed between the source and drain regions so as to be in contact with a portion of the top sides of both source and drain regions 202, 203. Source and drain electrodes 205, 206 are disposed so as to electrically contact the source and drain regions respectively. Electrodes 205, 206 may be made from metal, a transparent electrically-conductive film such as indium-tin-oxide (ITO), or a similar material. This structure is coated with a gate insulation layer 207. Gate electrode 208 is disposed in such a manner as to cover both source and drain regions 202, 203, or at least cover a part of each of them. Gate insulation layer 207 also serves as an interlayer insulation for interconnect materials.

The above-described prior art TFT structure has problems however, which are described with reference to FIG. 3. A graph is presented in FIG. 3, showing typical drain current versus gate voltage characteristics of an N-channel TFT having the conventional structure shown in FIG. 2. The horizontal axis indicates gate voltage Vgs, while the vertical axis indicates logarithm values of drain current Id.

In this example, a current that flows between the source and the drain when a transistor is in the OFF state, is called the OFF current; a current that flows between the source and the drain when a transistor is in the ON state, is called the ON current. A transistor having characteristics such that the ON current is large and the OFF current is small, or in other words, a high ON/OFF current ratio, is preferable. Large ON current capability provides for fast circuits while very small OFF currents provide for low power operation. Generally, ON and OFF currents tend to track with process variations, so if the ON current is increased, the OFF current has a tendency to increase. This fact poses a problem, particularly when an attempt is made to implement an integrated-driver liquid crystal device. That is, transistors used in the pixel section of a liquid crystal device are required to have low OFF current characteristics, whereas transistors used in the peripheral circuits are required to have high ON current characteristics in order to operate at high speed.

As can be seen from the drain current versus gate voltage curve of a conventional TFT shown in FIG. 3, the OFF current is a function of gate voltage, and more particularly, a function of the voltage between the gate and drain. In the case where no threshold adjusting implant has been performed in the channel region, the OFF current is minimum when Vgs is approximately zero. In other words, as the gate to drain electric field intensity is reduced, the OFF current will also be reduced.

A method of reducing the electric field intensity between the gate and drain involving lowering the impurity concentration of the drain is known. This method is explained with reference to FIGS. 4(a)–4(c).

FIG. 4(a) shows a pattern 402 comprised of a silicon thin film, such as poly-Si or a-Si formed on an insulating substrate 401 of glass, quartz, or sapphire. Next, this structure is coated with gate insulation layer 403 comprised of a material such as a silicon oxide film. Formed thereon is a gate electrode 404 which may be comprised of a metal, a transparent electrically-conductive film (e.g. ITO), an impurity doped poly-Si film, or the like.

Next, as shown in FIG. 4(b), by ion implanting, approximately $1\times10^{14}$ cm$^{-2}$ of donor or acceptor impurities, low-concentration source and drain regions 405, 406 are formed self-alignedly with respect to gate electrode 404.

FIG. 4(c) shows that after insulation layer 407 is formed on all of the above, this insulation layer 407 is anisotropically etched so that insulation layer 407 remains only on the side walls of gate electrode 404. That portion of silicon oxide film 407 that remains on the side walls of the gate becomes a barrier to subsequent ion implantation. By ion implanting, for example, approximately $1\times10^{15}$ cm$^{-2}$ of donor or acceptor impurities, source and drain regions 408, 409 are self-alignedly formed. Thus a transistor having a low impurity, or doping, concentration in the drain region is formed. This is sometimes referred to as a lightly doped drain (LDD) structure.

As shown in FIG. 4(d), source and drain electrodes 410, 411 are connected to source and drain regions 408, 409 respectively by means of well understood conventional processing steps.

However, there are problems associated with this device structure and method of manufacture. First, because the drain is formed by ion implantation, crystal damage is sustained, leading to a higher trap state density in the drain section of the silicon thin film. The trap state density in the drain is a major parameter affecting the OFF current. Second, the number of process steps, such as ion implantation, increases.

What is desirable is a thin film transistor structure which has very low subthreshold conduction (OFF) currents, a high ON-OFF current ratio compared to conventional TFTs, and which is also easy to manufacture.

SUMMARY OF THE INVENTION

It is an object of the present invention is to provide a thin film transistor having a high ON/OFF current ratio.

It is a further object of the present invention to provide a TFT structure which has very low leakage, or subthreshold conduction, currents.

Accordingly, the thin film transistor of the present invention is characterized by reduced lateral electric field intensity in the drain region and reduced implant-generated crystal damage in the drain region when compared to conventional TFTs. These characteristic features advantageously provide for a high ON/OFF current ratio, while providing very low OFF currents.

An offset-gate structure accounts for the reduction in electric field strength in the drain region. Doping the source and drain regions prior to the deposition of the thin film which forms the channel region means that the later deposited film experiences only a light doping and therefore less crystal damage and fewer trap states. The combination of reduced electric field and reduced trap state density leads to a very low OFF current while not significantly affecting the ON current. The reason the ON current is not significantly degraded is that the channel section silicon layer is thin. This means the range in which a depletion layer extends is limited and an inversion layer is likely to be formed. Therefore, if the length of the offset section is optimized, a decrease in the ON current can be suppressed. As a result, it has become possible to provide a thin film transistor having a large ON/OFF ratio. This optimized length is determined empirically by fabricating a large number of TFTs having different offset lengths, and measuring their electrical characteristics to find the offset lengths which give the best performance.

An advantage of the present invention is that, a considerable improvement in the performance of liquid crystal displays and a reduction in the costs thereof can be achieved by replacing conventional TFTs, with TFTs of the present invention. For example, in a conventional liquid crystal display, since the OFF current of a TFT used in the pixel section is undesirably large, transistors are connected in series in order to reduce the OFF current. However, because this does not have to be done if the TFT of the present invention is used, the yield and the picture quality of the display can be enhanced.

BRIEF DESCRIPTION OF THE DRAWINGS

FIG. 1 is a cross-sectional view showing an example structure of the TFT of the present invention.

FIG. 2 is a cross-sectional view showing an example structure of the conventional TFT.

FIG. 3 is a graph showing a drain current versus gate voltage curve for a conventional TFT.

FIGS. 4(a) to 4(d) are cross-sectional views illustrating the structure of a TFT which uses the known LDD method of reducing OFF current.

FIG. 5 is a graph showing drain current versus gate voltage characteristics of the TFT of the present invention.

FIGS. 6(a) to 6(c), FIGS. 7(a) to 7(c), FIGS. 8(a) to 8(c), FIGS. 9(a) to 9(c), FIGS. 10(a) to 10(d), FIGS. 11(a) to 11(d), FIGS. 12(a) to 12(d),

FIGS. 13(a) to 13(d), FIGS. 14(a) to 14(c), and FIGS. 15(a) to 15(c) are cross-sectional views illustrating intermediate manufacturing steps in which a TFT of the present invention is fabricated.

FIG. 16 is a cross-sectional view showing the structure of one embodiment of the present invention.

DETAILED DESCRIPTION OF THE INVENTION

The thin film transistor structure of the present invention, and several methods of manufacturing the same, are now described with reference to the accompanying drawings.

FIG. 1 is a cross-sectional view showing the structure of a thin film transistor according to the present invention. Opposing source and drain areas 102, 103 which are comprised of a silicon thin film, such as poly-Si or a-Si, in which an impurity is added, are formed on an insulating substrate 101 of glass, quartz, sapphire or the like. As will be understood by those skilled in the art, the impurity can be either a donor or acceptor type depending on whether a P-channel or N-channel transistor is to be made. Channel area 104 is comprised of a silicon thin film, such as poly-Si or a-Si, disposed so as to be in contact with source and drain areas 102, 103 in such a manner as to connect the two areas. Source and drain electrodes 105, 106 are disposed so as to be in contact with source and drain areas 102, 103 respectively. Source and drain electrodes 105, 106 may be comprised of a metal, a transparent electrically-conductive film (e.g. ITO), or the like. The above-described structure is coated with gate insulation layer 107, comprised of a material such as a silicon oxide. Gate electrode 108 which may be comprised of a metal, a transparent electrically-conductive film (e.g. ITO), or the like, is disposed in such a manner as not to cover (i.e. overlap) either source or drain areas 102, 103, or at least not to cover drain area 103. Gate insulation layer 107 also acts as an interlayer insulation layer for maintaining electrical separation between interconnect layers.

The TFT structure of the present invention can be fabricated by means of several alternative processes. Ten example processes are described below.

Process Example #1

The TFT of the present invention can be fabricated with the process steps illustrated by the cross-sectional views of FIGS. 6(a)–6(c).

FIG. 6(a) shows patterns 602, 603 which are comprised of a silicon thin film, such as poly-Si or a-Si, formed on an insulating substrate 601 of glass, quartz, sapphire or the like. Pattern 604 comprised of a silicon thin film, such as poly-Si or a-Si, is disposed so as to be in contact with the top side of the two pattern areas 602, 603 in such a manner as to connect the two areas. Next, all of the above is coated with gate insulation layer 605 which may be comprised of an insulator such as a silicon oxide film, or the like. Formed thereon is gate electrode 606, comprised of a metal, a transparent electrically conductive film (e.g. ITO), or a poly-Si film.

Next, as shown in FIG. 6(b), an insulation layer 607 is formed on all of the above. Insulation layer 607 is preferably a silicon oxide film. That portion of film 607 formed on the side walls of the gate is effectively a thick film when seen from a vertical direction and serves as a barrier for subsequent ion implantation. By ion implanting impurities (donor or acceptor depending on whether N-channel or P-channel devices are desired), source and drain areas 608, 609 are formed self-alignedly with gate electrode 606. As a result, a transistor having an offset gate structure is formed.

Thereafter, as shown in FIG. 6(c), source and drain electrodes 610, 611 which may be comprised of a metal, a transparent electrically-conductive film (e.g. ITO), or the like, are connected to source and drain areas 608, 609 respectively by means of the usual process steps as would be understood by those skilled in this art. Thus, a TFT of the present invention is completed.

Process Example #2

The TFT of the present invention can be fabricated with the process steps illustrated by the cross-sectional views of FIGS. 7(a)–7(c).

FIG. 7(a) shows patterns 702, 703 which are comprised of a silicon thin film, such as poly-Si or a-Si, formed on an insulating substrate 701 of glass, quartz, sapphire or the like. Pattern 704, comprised of a silicon thin film, such as poly-Si or a-Si, is disposed so as to be in contact with the top side of the two pattern areas 702, 703 in such a manner as to connect the two areas. Next, all of the above is coated with a gate insulation layer 705, which may be comprised of an insulator such as a silicon oxide film, or the like. Formed thereon is gate electrode 706, comprised of a metal, a transparent electrically-conductive film (e.g. ITO), or a poly-Si film.

As shown in FIG. 7(b), after formation of insulation layer 707 on all of the above, anisotropic etching is performed so that insulation layer 707 remains only on the side walls of gate electrode 706. Insulation layer 707 is preferably a silicon oxide film. That portion of silicon oxide film 707 that remains on the side walls of the gate after etching, acts as a barrier to subsequent ion implantation. By ion implanting impurities (donor or acceptor depending on whether N-channel or P-channel devices are desired) source and drain areas 708, 709 are formed self-alignedly with gate electrode 706. As a result, a transistor having an offset gate structure is formed.

Thereafter, as shown in FIG. 7(c), source and drain electrodes 710, 711 which may be comprised of a metal, a transparent electrically-conductive film (e.g. ITO), or the like, are connected to source and drain areas 708, 709 respectively according to the usual process steps as would be understood by those skilled in this art. Thus, a TFT of the present invention is completed.

Process Example #3

The TFT of the present invention can be fabricated with the process steps illustrated by the cross-sectional views of FIGS. 8(a)–8(c).

FIG. 8(a) shows patterns 8 02, 803 which are comprised of a silicon thin film, such as poly-Si or a-Si, formed on an insulating substrate 801 of glass, quartz, sapphire or the like. Pattern 804 comprised of a silicon thin film, such as poly-Si or a-Si, is disposed so as to be in contact with the top side of the two pattern areas 802, 803 in such a manner as to connect the two areas. Next, formed thereon, are a gate insulation layer 805 preferably comprised of a silicon oxide film and an electrically conductive film 806 which will eventually serve as a gate electrode. Next, as shown in FIG. 8(b) a photoresist pattern 807 is formed on the electrically conductive film 806 by using a standard photomasking technique. With this pattern as an etch mask, the electrically conductive film 806 is selectively etched in such a way that it is small relative to the photoresist pattern (i.e. laterally overetched), thus forming gate electrode 808. That is, etching continues until the gate electrode material is undercut with respect to the overlying photoresist. In this way the overhanging portions of photoresist pattern 807 are able to act as an ion implant barrier and facilitate source/drain formation that is aligned to the photoresist and not the gate electrode. Ion implantation of impurity atoms (donor or acceptor as described above) forms source and drain areas 809,810 self-aligned to photoresist pattern 807. Photoresist pattern 807 is then removed.

Thereafter, as shown in FIG. 8(c), source and drain electrodes 811, 812 which may be comprised of a metal, a transparent electrically-conductive film (e.g. ITO), or the like, are connected to source and drain areas 809, 810 respectively, according to the usual process steps as would be understood by those skilled in this art. Thus, a TFT of the present invention is completed.

Process Example #4

The TFT of the present invention can be fabricated with the process steps illustrated by the cross-sectional views of FIGS. 9(a)–9(c).

FIG. 9(a) shows patterns 902, 903 which are comprised of a silicon thin film, such as poly-Si or a-Si, formed on an insulating substrate 901 of glass, quartz, sapphire or the like. Pattern 904 comprised of a silicon thin film, such as poly-Si or a-Si, is disposed so as to be in contact with the top side of the two pattern areas 902, 903 in such a manner as to connect the two areas. Next, formed in turn thereon, are gate insulation layer 9 05 comprised of an insulator, such as silicon oxide film, and an electrically conductive film 906 which will eventually serve as a gate electrode.

Next, as shown in FIG. 9(b), a photoresist pattern 907 is formed on electrically conductive film 906 by using standard photomasking techniques. With this pattern as a mask, electrically conductive film 906 is selectively etched, and a gate electrode, the lateral dimensions of which approximate those of the overlying photoresist, is formed. This is followed by ion implantation of (donor or acceptor as described above) impurity atoms, thereby forming source and drain areas 909, 910 which are self-aligned with respect to both the gate electrode and the overlying photoresist. The gate electrode is then etched so that it is small relative to the overlying photoresist pattern 907 to form gate electrode 908. Photoresist pattern 907 is then removed.

Thereafter, as shown in FIG. 9(c), source and drain electrodes 911, 912 which are comprised of a metal, a transparent electrically-conductive film (e.g. ITO), or the like, are connected to the source and drain areas 909, 910 respectively, according to the usual process steps as would be understood by those skilled in this art. Thus, a TFT of the present invention is completed.

Process Example #5

The TFT of the present invention can be fabricated with the process steps illustrated by the cross-sectional views of FIGS. 10(a)–10(d).

FIG. 10(a) shows patterns 1002, 1003 which are comprised of a silicon thin film, such as poly-Si or a-Si, formed on an insulating substrate 1001 of glass, quartz, sapphire or the like. Pattern 1004 comprised of a silicon thin film, such as poly-Si or a-Si, is disposed so as to be in contact with the top side of the two pattern areas 1002, 1003 so as to connect the two areas. Next, formed in turn thereon are gate insulation layer 1005 comprised of an insulator such as a silicon oxide film, electrically conductive film 1006 which will eventually serve as a gate electrode, and silicon oxide film 1007.

Next, as shown in FIG. 10(b), photoresist pattern 1008 is formed on silicon oxide film 1007 by using a standard photomasking technique. With this pattern as a mask, the silicon oxide film 1007 is selectively etched to form patterned, post-etch silicon oxide film 1007A.

Thereafter, as shown in FIG. 10(c), photoresist pattern 1008 is removed. Then, with post-etch silicon oxide film 1007A as a mask, electrically conductive film 1006 is selectively etched so that it is small relative to post-etch silicon oxide film 1007A. That is, etching continues until the gate electrode material is undercut with respect to the overlying oxide. In this way the overhanging portions of oxide 1007A are able to act as an ion implant barrier and facilitate source/drain formation that is aligned to the oxide and not the gate electrode. Gate electrode 1009 is formed in this way. Ion implantation of impurity atoms (donor or acceptor as described above) forms source and drain areas 1010, 1011 self-aligned to oxide 1007A.

Thereafter, as shown in FIG. 10(*d*), source and drain electrodes 1012, 1013 which are comprised of a metal, a transparent electrically-conductive film (e.g. ITO), or the like, are connected to source and drain areas 1010, 1011 respectively, according to the usual process steps as would be understood by those skilled in this art. Thus, a TFT of the present invention is completed.

Process Example #6

The TFT of the present invention can be fabricated with the process steps illustrated by the cross-sectional views of FIGS. 11(*a*)–11(*d*).

FIG. 11(*a*) shows patterns 1102, 1103 which are comprised of a silicon thin film, such as poly-Si or a-Si, formed on an insulating substrate 1101 of glass, quartz, sapphire or the like. Pattern 1104 comprised of a silicon thin film, such as poly-Si or a-Si, is disposed so as to be in contact with the top side of the two pattern areas 1102, 1103 so as to connect the two areas. Next, formed in turn on all of the above, are gate insulation layer 1105 comprised of an insulator such as a silicon oxide film, electrically conductive film 1106 which will eventually serve as a gate electrode, and a silicon oxide film 1107.

Next, as shown in FIG. 11(*b*), photoresist pattern 1108 is formed on silicon oxide film 1107 by using a standard photomasking technique. With this pattern as a mask, silicon oxide film 1107 is selectively etched to form post-etch oxide film 1107A.

Thereafter, as shown in FIG. 11(*c*), photoresist pattern 1107 is removed. Then, with silicon oxide film 1107 as a mask, electrically conductive film 1106 is selectively etched and a gate electrode is formed. Ion implantation of impurity atoms (donor or acceptor as described above) forms source and drain areas 1110, 1111 self-aligned to post-etch silicon oxide film 1107A. Next, the gate electrode 1109 is selectively etched so that it is small relative to post-etch silicon oxide film 1107A, thus forming offset gate electrode 1109.

This is similar to Process Example #5, however, in Example #5, the gate electrode is over-etched, with respect to the overlying oxide layer, prior to ion implantation (i.e. source/drain formation). In Example #6, the source/drain forming ion implant is done while the gate electrode is substantially of the same dimension as the overlying oxide layer. After ion implant, in Example #6, the gate electrode is further etched so as to produce a gate electrode offset from the source and drain.

Thereafter, as shown in FIG. 11(*d*), source and drain electrodes 1112, 1113 which may be comprised of a metal, a transparent electrically-conductive film (e.g. ITO), or the like, are connected to source and drain areas 1110, 1111 respectively, according to the usual process steps as would be understood by those skilled in this art. Thus, a TFT of the present invention is completed.

Process Example #7

The TFT of the present invention can be fabricated with the process steps illustrated by the cross-sectional views of FIGS. 12(*a*)–12(*d*).

FIG. 12(*a*) shows patterns 1202, 1203 which are comprised of a silicon thin film, such as poly-Si or a-Si, formed on an insulating substrate 1201 of glass, quartz, sapphire or the like. Pattern 1204 comprised of a silicon thin film, such as poly-Si or a-Si, is disposed so as to be in contact with the top side of the two pattern areas 1202, 1203 so as to connect the two areas. Next, formed in turn on all of the above are gate insulation layer 1205 comprised of an insulator such as a silicon oxide film, and electrically conductive film 1206 which will eventually serve as a gate electrode.

Next, as shown in FIG. 12(*b*), photoresist pattern 1207 is formed on electrically conductive film 1206 by using a standard photomasking technique. With this pattern as a mask, electrically conductive film 1206 is etched to form gate electrode 1208.

FIG. 12(*c*), shows source and drain regions 1209, 1210 formed, self-alignedly to gate electrode 1208, by ion implantation. Next, gate electrode 1208 is selectively etched so as to be small, thus producing the offset gate structure 1208A.

Thereafter, as shown in FIG. 12(*d*), source and drain electrodes 1211, 1212 which are comprised of a metal, a transparent electrically-conductive film (e.g. ITO), or the like, are connected to source and drain areas 1210, 1211 respectively according to the usual process steps as would be understood by those skilled in this art. Thus, a TFT of the present invention is completed.

Process Example #8

The TFT of the present invention can be fabricated with the process steps illustrated by the cross-sectional views of FIGS. 13(*a*)–13(*d*).

FIG. 13(*a*) shows patterns 1302, 1303 which are comprised of a silicon thin film, such as poly-Si or a-Si, formed on an insulating substrate 1301 of glass, quartz, sapphire or the like. Pattern 1304 comprised of a silicon thin film, such as poly-Si or a-Si, is disposed so as to be in contact with the top side of the two patterns 1302, 1303 so as to connect the two patterns. Next, formed in turn on all of the above, are gate insulation layer 1305 comprised of an insulator such as a silicon oxide film, electrically conductive film 1306 which will eventually serve as a gate electrode, and silicon oxide film 1307.

Next, as shown in FIG. 13(*b*), photoresist pattern 1308 is formed on silicon oxide film 1307 by using a standard photomasking technique. With this photoresist pattern as a mask, silicon oxide film 1307 is selectively etched to form post-etch oxide pattern 1307A.

Then, as shown in FIG. 13(*c*), with silicon oxide film 1307A as a mask, electrically conductive film 1306 is selectively etched and gate electrode 1309 is formed. Thereafter, photoresist pattern 1308 is removed. Then insulation layer 1310, which is preferably a silicon oxide film, or the like, is formed on all of the above. Then silicon oxide film 1310 is anisotropically etched so that it remains on the side walls of gate electrode 1309. At this point in the process, gate electrode 1309 is coated with the silicon oxide films 1307 and 1310. Ion implantation of impurity atoms (donor or acceptor as described above) forms source and drain areas 1311, 1312 self-aligned to the sidewall plus gate electrode structure just described.

Thereafter, as shown in FIG. 13(*d*), source and drain electrodes 1313, 1314 which are comprised of a metal, a transparent electrically-conductive film (e.g. ITO), or the like, are connected to source and drain areas 1311, 1312 respectively, according to the usual process steps as would be understood by those skilled in this art. Thus, a TFT of the present invention is completed.

Process Example #9

The TFT of the present invention can be fabricated with the process steps illustrated by the cross-sectional views of FIGS. 14(a)–13(c)

FIG. 14(a) shows pattern 1402 which is comprised of a silicon thin film, such as poly-Si or a-Si, disposed on an insulating substrate 1401 of glass, quartz, sapphire or the like. Next, all of the above is coated with gate insulation layer 1403 comprised of an insulator such as a silicon oxide film. Formed thereon, is gate electrode 1404 which may be comprised of a metal, an electrically conductive film, a poly-Si film to which an impurity is added, or the like.

Next, as shown in FIG. 14(b), insulation layer 1405 is formed on all of the above. Insulation layer 1405 is preferably an oxide of silicon. Next, insulation layer 14 05 and gate insulation layer 1403 are selectively etched so that at least a portion of pattern 1402 is exposed. Next, patterns 14 06 and 14 0 7 which are comprised of a poly-Si film, in which an impurity is added, are formed so as to connect to pattern 1402. These patterns act as source/drain regions 1406, 1407, respectively.

Thereafter, as shown in FIG. 14(c), source and drain electrodes 1408, 1409 which are comprised of a metal, a transparent electrically-conductive film (e.g. ITO), or the like, are connected to source and drain areas 1406, 1407 respectively, according to the usual process steps as would be understood by those skilled in this art. Thus, a TFT of the present invention is completed.

Process Example #10

The TFT of the present invention can be fabricated with the process steps illustrated by the cross-sectional views of FIGS. 15(a)–15(c).

FIG. 15(a) shows patterns 1502, 1503 which are comprised of a silicon thin film, such as poly-Si or a-Si, formed on an insulating substrate 1501 of glass, quartz, sapphire or the like. Pattern 1504 comprises a silicon thin film, such as poly-Si or a-Si, disposed so as to be in contact with the top side of the two patterns 1502, 1503. Next, all of the above is coated with gate insulation layer 1505 which is comprised of an insulator such as a silicon oxide film. Formed thereon is gate electrode 1506 comprised of a metal, an electrically conductive film, a poly-Si layer in which an impurity is added, or the like.

Then, as shown in FIG. 15(b), insulation layer 1507 comprising a silicon oxide film, or the like, is formed on all of the above. Next, a photoresist pattern 1508 is formed thereon by using a standard photomasking technique. With this pattern as a mask, ion implantation of impurity atoms (donor or acceptor as described above) forms source and drain areas 1509, 1510 self-aligned to photoresist pattern 1508.

Thereafter, as shown in FIG. 15(c), photoresist pattern 1508 is removed. Source and drain electrodes 1511, 1512 which are comprised of a metal, a transparent electrically-conductive film (e.g. ITO), or the like are connected to source and drain areas 1509, 1510 respectively according to the usual process steps as would be understood by those skilled in this art. Thus, a TFT of the present invention is completed.

Conclusion

As set forth above, the present invention can be used for many applications in which thin film transistors are used, for example, image sensors or liquid crystal displays. The present invention makes a great contribution toward improving the performance of these devices while reducing the costs thereof.

It should also be noted that the thin film which is used to form the channel region in accordance with this invention may be recrystallized or not.

With respect to polycrystalline silicon films it has been found that generally, the thinner the film is made the better are the TFT properties. However, it has been found that it is only down to about 100 Å that polycrystalline silicon films behave as polycrystalline silicon, and that as these films become thinner they physically behave as amorphous silicon. In consideration of the physical changes that take place at about 100 Å thickness and the controllability of film thickness during processing, 250 Å film thickness has been chosen for typical implementations of the present invention.

With respect to recrystallized silicon films, crystal grain size is an important parameter in determining TFT properties. Generally, with other parameters held constant, bigger grain size gives better TFT properties. In a recrystallization process it is easier to achieve larger grain size as the starting film thickness is increased. Therefore the determination of film thickness is made by considering the trade-offs between thicker films (i.e. larger grain size) and thinner films (better transistor characteristics). In typical implementations of the present invention, 250 Å film thickness is chosen even if the film is to be recrystallized.

The film thicknesses typically used for the layers described in the various embodiments are approximately 250 Å for the channel region film, approximately 1500 Å for the initial pattern films, between approximately 500 Å and 4,000 Å for the gate electrode film, approximately 8,000 Å for the source and drain contact materials, and between approximately 1,000 Å and 2,000 Å for the gate dielectric layer.

The present invention can be realized by using materials other than those mentioned above without departing from the spirit and scope of the present invention. Various embodiments are explained primarily by showing a structure in which the thickness of silicon films of the source and drain areas are different from that of the channel section. However, as shown in FIG. 16, a thin film transistor having a structure in which the thickness of silicon films of, for example, source area 1601 and drain area 1602, are the same as that of channel area 1603, may be used within the spirit and scope of the present invention.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the subjoined claims.

What is claimed is:

1. A method of manufacturing thin film transistors, comprising the steps of:

a) forming a first thin silicon film on an insulation substrate;

b) forming two patterns by selectively etching said first thin silicon film;

c) disposing a second thin silicon film on said substrate, with at least a portion of said second thin silicon film being disposed between said two patterns and connecting said two patterns;

d) forming, in turn, a gate insulation layer and an electrically conductive film on said two patterns and said second thin silicon film;

e) forming a gate electrode by selectively etching said electrically conductive film;

f) forming an insulation film on side walls of said gate electrode; and g) forming a source region and a drain region self-aligned to said gate electrode and said insulation film on said side walls by adding impurities to said two patterns and portions of said second thin silicon film with said gate electrode and said insulation film on said side walls as a mask;

wherein said gate electrode does not overlap said source and drain areas and is laterally offset from said source and drain areas.

2. The method of claim 1 wherein said impurities are added by ion implantation.

3. A method of manufacturing thin film transistors on an insulation substrate, comprising the steps of:

a) forming a first thin silicon film on an insulation substrate;

b) forming two patterns by selectively etching said first thin silicon film;

c) disposing a second thin silicon film on said substrate, with: at least a portion of said second thin silicon film being disposed between said two patterns and connecting said two patterns;

d) forming, in turn, a gate insulating layer and an electrically conductive film on said two patterns and said second thin silicon film;

e) forming a gate electrode by selectively etching said electrically conductive film;

f) forming an insulation layer over said gate electrode;

g) etching said insulation layer, formed on said gate electrode, by anisotropic etching in such a manner that a portion of said insulation layer remains on the side walls of said gate electrode and form sidewalls of said gate electrode; and h) forming a source region and a drain region self-aligned to said gate electrode and said sidewalls by adding impurities to said two patterns and portions of said second thin silicon film with said gate electrode and said sidewalls as a mask;

wherein said gate electrode does not overlap said source and drain areas and is laterally offset from said source and said drain areas.

4. A method of manufacturing a thin film transistor, having a source region, a drain region and a gate electrode, in which the gate electrode does not overlap the source region and the drain region, comprising the steps of:

a) forming a first thin silicon film on an insulating substrate;

b) forming two patterns by selectively etching said first thin film;

c) disposing a second thin silicon film on said substrate, with at least a portion of said second thin silicon film being disposed between said two patterns and connecting said two patterns;

d) forming in turn, a gate insulation layer an electrically conductive film, and a first insulating layer on said two patterns and second thin silicon film;

e) forming an insulation pattern by selectively etching said first insulating layer;

f) forming a gate electrode by selectively etching said electrically conductive film with said insulation pattern as a mask;

g) forming a second insulating layer over said insulation pattern and said gate electrode;

h) etching said second insulating layer by anisotropic etching in such a manner that a portion of said second insulating layer remains on the side walls of said gate electrode and said insulation pattern and form the sidewalls of said gate electrode and said insulation pattern; and i) forming a source region and a drain region self-aligned to said gate electrode, said insulation pattern and said sidewalls by adding impurities to said two patterns and portions of said second thin silicon film with said gate electrode, said insulation pattern and said sidewalls as a mask;

wherein said gate electrode does not overlap said source and drain areas and is laterally offset from said source and drain areas.

5. A method of manufacturing a thin film transistor having a source region, a drain region and a gate electrode, comprising the steps of:

a) forming a thin silicon film on an insulating substrate;

b) forming, in turn, a gate insulation layer and a gate electrode on said first thin silicon film;

c) forming an insulation layer on top of said gate electrode and said gate insulation layer;

d) selectively etching said insulation layer and said gate insulation layer so that a portion of said thin silicon film on each side of said gate electrode is exposed as an exposed portion; and e) forming a source region and a drain region by depositing a doped silicon layer on and covering each said exposed portion of said first thin silicon film, wherein said gate electrode does not overlap said source region and drain region.

6. A method of manufacturing thin film transistors, comprising the steps of:

a) forming a first thin silicon film on an insulation substrate;

b) forming two patterns by selectively etching said first thin silicon film;

c) adding impurities to said two patterns;

d) disposing a second thin silicon film on said substrate, with at least a portion of said second thin silicon film being disposed between said two patterns and connecting said two patterns;

e) forming, in turn, a gate insulation layer and an electrically conductive film on said two patterns and said second thin silicon film;

f) forming a gate electrode by selectively etching said electrically conductive film;

g) forming an insulation film on side walls of said gate electrode; and h) forming a source region and a drain region self-aligned to said gate electrode and said insulation film on said side walls by adding impurities to portions of said second thin silicon film with said gate electrode and said insulation film on side walls as a mask;

wherein said gate electrode does not overlap said source and drain areas and is laterally offset from said source and drain areas.

7. The method of claim 6, wherein in the step of disposing a second thin silicon film, a portion of said second thin silicon film is disposed on top of at least a portion of each of said two patterns.

8. The method of claim 1, wherein in the step of disposing a second thin silicon film, a portion of said second thin silicon film is disposed on top of at least a portion of each of said two patterns.

9. The method of claim 3, wherein in the step of disposing a second thin silicon film, a portion of said second thin silicon film is disposed on top of at least a portion of each of said two patterns.

10. The method of claim 4, wherein in the step of disposing a second thin silicon film, a portion of said second thin silicon film is disposed on top of at least a portion of each of said two patterns.

11. A method of manufacturing thin film transistors on an insulation substrate, comprising the steps of:

a) forming a first thin silicon film on an insulation substrate;

b) forming two patterns by selectively etching said first thin silicon c) disposing a second thin silicon film on said substrate, with at least a portion of said second thin silicon film being disposed between said two patterns and connecting said two patterns;

d) forming, in turn, a gate insulating layer and an electrically conductive film on said two patterns and said second thin silicon film;

e) forming a gate electrode by selectively etching said electrically conductive film;

f) forming an insulation layer over said gate electrode, such that a portion of said insulation layer is formed on each side wall of said gate electrode; and g) forming a source region and a drain region self-aligned to said gate electrode and said portions of said insulation layer on the sidewalls by adding impurities to said two patterns and portions of said second thin silicon film with said gate electrode and said portions on the sidewalls as a mask;

wherein said gate electrode does not overlap said source and drain areas and is laterally offset from said source and drain areas.

12. The method of claim 11, wherein in the step of disposing a second thin silicon film, a portion of said second thin silicon film is disposed on top of at least a portion of each of said two patterns.

* * * * *